US009548758B2

(12) United States Patent
Marzetta et al.

(10) Patent No.: US 9,548,758 B2
(45) Date of Patent: Jan. 17, 2017

(54) SECURE COMPRESSIVE SAMPLING USING CODEBOOK OF SAMPLING MATRICES

(75) Inventors: Thomas L. Marzetta, Summit, NJ (US); Emina Soljanin, Green Village, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 2053 days.

(21) Appl. No.: 12/652,372

(22) Filed: Jan. 5, 2010

(65) Prior Publication Data

US 2011/0164745 A1 Jul. 7, 2011

(51) Int. Cl.
*H04L 9/28* (2006.01)
*H03M 7/30* (2006.01)

(52) U.S. Cl.
CPC ...................................... *H03M 7/30* (2013.01)

(58) Field of Classification Search
CPC ... H04N 19/00775; H04L 9/06; H04L 9/0618; H04L 25/042; H03M 7/30
USPC .................................................... 380/28, 376
See application file for complete search history.

(56) References Cited

U.S. PATENT DOCUMENTS

| 4,379,205 | A | * | 4/1983 | Wyner | 380/28 |
| 5,872,540 | A | * | 2/1999 | Casabona et al. | 342/362 |
| 6,693,976 | B1 | * | 2/2004 | Hassibi et al. | 375/299 |
| 7,450,720 | B2 | * | 11/2008 | Roelse | H04L 9/0618 380/259 |
| 2001/0024502 | A1 | * | 9/2001 | Ohkuma et al. | 380/46 |
| 2009/0196513 | A1 | * | 8/2009 | Tian et al. | 382/232 |
| 2010/0061477 | A1 | * | 3/2010 | Lee et al. | 375/267 |
| 2016/0204795 | A1 | * | 7/2016 | Huang | H03M 7/30 341/87 |

OTHER PUBLICATIONS

Design of LDPC-based Error Correcting Cipher; Qing Su, Yang Xiao; IEEE 2008.*
Coding of spectral magnitudes using optimized linear transformations, Etemoglu et al, Speech Coding; IEEE Workshop, 2000.*
Y. Rachlin et al., "The Secrecy of Compressed Sensing Measurements," IEEE 46th Annual Allerton Conference on Communication, Control, and Computing, Sep. 2008, pp. 813-817.

(Continued)

*Primary Examiner* — Luu Pham
*Assistant Examiner* — Jahangir Kabir
(74) *Attorney, Agent, or Firm* — Ryan, Mason & Lewis, LLP

(57) ABSTRACT

In one aspect, a compressive sampling encoder comprises matrix determination circuitry configured to determine a particular sampling matrix selected from a codebook comprising a plurality of sampling matrices. The compressive sampling encoder further comprises sampling circuitry coupled to the matrix determination circuitry and configured to apply the particular sampling matrix to a first signal to generate a second signal, and encryption circuitry configured to receive an identifier of the particular sampling matrix and to encrypt the identifier of the particular sampling matrix. The compressive sampling encoder provides at one or more outputs thereof the second signal and the encrypted identifier of the particular sampling matrix. Other aspects include a compressive sampling decoder, compressive sampling encoding and decoding methods, and associated computer program products.

20 Claims, 3 Drawing Sheets

(56) References Cited

OTHER PUBLICATIONS

A. Orsdemir et al., "On the Security and Robustness of Encryption via Compressed Sensing," IEEE Military Communications Conference, Nov. 2008, pp. 1-7.

Jiangtao Wen, "Key Issues in Secure, Error Resilient Compressive Sensing of Multimedia," IEEE International Conference on Multimedia and Expo, Jun.-Jul. 2009, pp. 1590-1591.

Iddo Drori, "Compressed Video Sensing," http://www.cs.tau.ac.il/~idori/cvs.pdf, 2008, 2 pages.

Emmanuel J. Candès, "Compressive Sampling," 2006 European Mathematical Society, Proceedings of the International Congress of Mathematicians, 2006, pp. 1-20. Madrid, Spain.

E.J. Candès et al., "An Introduction to Compressive Sampling," IEEE Signal Processing Magazine, Mar. 2008, pp. 21-30, vol. 25, No. 2.

T.L. Marzetta et al., "Capacity of a Mobile Multiple-Antenna Communication Link in Rayleigh Flat Fading," IEEE Transactions on Information Theory, Jan. 1999, pp. 139-157, vol. 45, No. 1.

T.L. Marzetta et al., "Structured Unitary Space-Time Autocoding Constellations," IEEE Transactions on Information Theory, Apr. 2002, pp. 942-950, vol. 48, No. 4.

\* cited by examiner

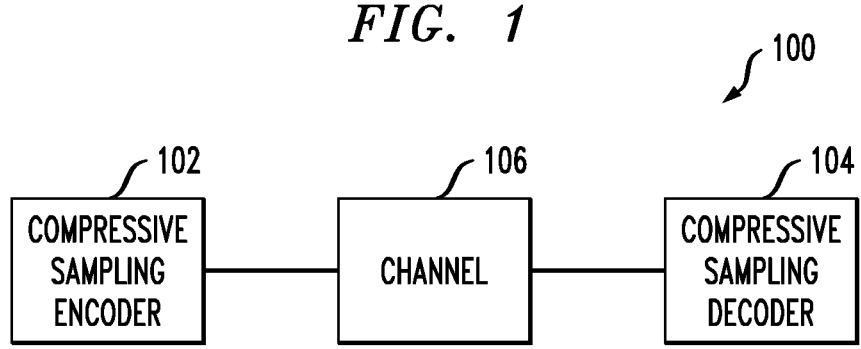
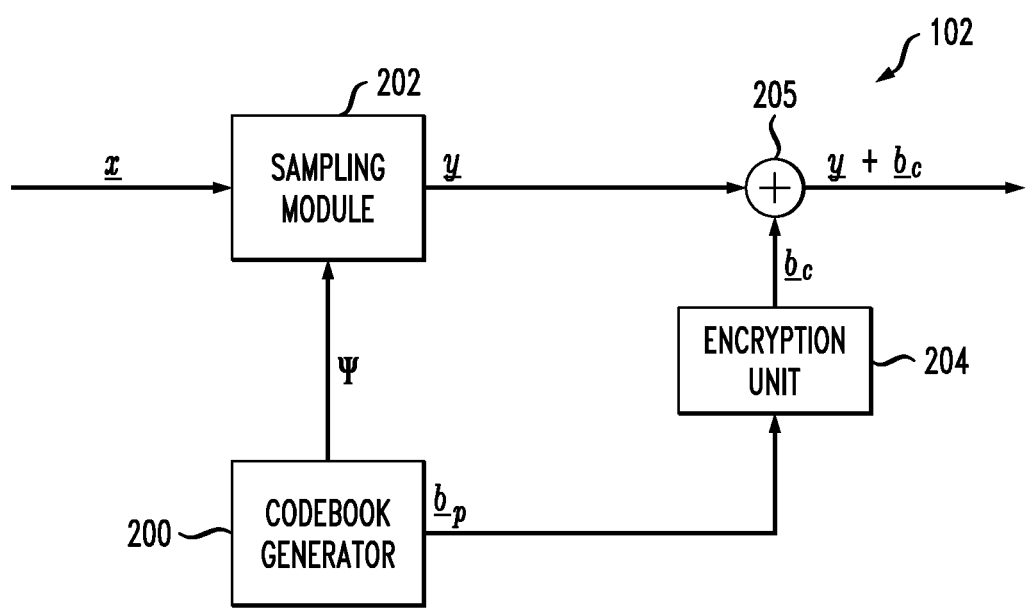

SECURE COMPRESSIVE SAMPLING USING CODEBOOK OF SAMPLING MATRICES

FIELD OF THE INVENTION

The present invention relates generally to the field of signal processing, and more particularly to compressive sampling.

BACKGROUND OF THE INVENTION

Compressive sampling, also known as compressed sampling, compressed sensing or compressive sensing, is a data sampling technique which often exhibits improved efficiency relative to conventional Nyquist sampling. Compressive sampling may be characterized mathematically as multiplying an N-dimensional data vector x by the conjugate-transpose of an N×M dimensional sampling matrix $\Psi$ to yield an M-dimensional compressed measurement vector y, where typically M is much smaller than N. If the data vector x happens to be sparse in some domain that is linearly related to x, then x can be recovered from the compressed measurement vector y provided that the sampling matrix $\Psi$ satisfies the so-called restricted isometry property. For additional details see, for example, E. J. Candès and M. B. Wakin, "An Introduction to Compressive Sampling," IEEE Signal Processing Magazine, Vol. 25, No. 2, March 2008, and E. J. Candès, "Compressive Sampling," Proceedings of the International Congress of Mathematicians, Madrid, Spain, 2006, both of which are incorporated by reference herein. As sparse signals constitute a large majority of signals encountered in nature as well as in man-made systems, compressive sampling is expected to come into increasingly widespread use for efficient transmission and storage of such signals.

Although it is known that sparse signals can be efficiently transmitted, stored or otherwise processed using compressive sampling, such processing does not necessarily provide adequate levels of security. Security in the context of compressive sampling is addressed, by way of example, in A. Orsdemir et al., "On the Security and Robustness of Encryption Via Compressed Sampling," IEEE Military Communications Conference (MILCOM) 2008, San Diego, Calif., Nov. 16-19, 2008, pp. 1-7, J. Wen, "Key Issues in Secure, Error Resilient Compressive Sensing of Multimedia Content," IEEE International Conference on Multimedia and Expo (ICME) 2009, New York, N.Y., Jun. 28-Jul. 3, 2009, pp. 1590-1591, and Y. Rachlin and D. Baron, "The Secrecy of Compressed Sensing Measurements," 46th Annual Allerton Conference on Communication, Control, and Computing, Urbana-Champaign, Ill., Sep. 23-26, 2008, pp. 813-817, all of which are incorporated by reference herein. However, conventional compressive sampling as described in the above-cited references fails to provide sufficient security for transmission, storage or other processing of the compressed measurement vector y, such that the data vector x can be recovered only by authorized parties, while maintaining the overall efficiency of the compressive sampling process.

SUMMARY OF THE INVENTION

Illustrative embodiments of the present invention overcome the above-described drawbacks of conventional compressive sampling. In one or more of these embodiments, a given compressed measurement vector y is generated and securely transmitted, stored or otherwise processed in a manner that ensures that the corresponding original data vector x can be recovered only by authorized parties, without significantly reducing the efficiency of the compressive sampling process.

In accordance with one aspect of the invention, a compressive sampling encoder comprises matrix determination circuitry configured to determine a particular sampling matrix selected from a codebook comprising a plurality of sampling matrices. The compressive sampling encoder further includes sampling circuitry coupled to the matrix determination circuitry and configured to apply the particular sampling matrix to a first signal to generate a second signal, and encryption circuitry configured to receive an identifier of the particular sampling matrix and to encrypt the identifier of the particular sampling matrix. The compressive sampling encoder provides at one or more outputs thereof the second signal and the encrypted identifier of the particular sampling matrix.

In accordance with another aspect of the invention, a compressive sampling decoder comprises decryption circuitry configured to receive an encrypted identifier of a particular sampling matrix selected from a codebook comprising a plurality of sampling matrices and to decrypt the encrypted identifier of the particular sampling matrix. The compressive sampling decoder further comprises matrix determination circuitry configured to determine the particular sampling matrix based on the decrypted identifier, and inverse sampling circuitry coupled to the matrix determination circuitry and configured to generate a first signal by applying an inverse of the particular sampling matrix to a second signal.

The illustrative embodiments provide significant advantages over conventional approaches. For example, in one or more of these embodiments, a very high level of security can be provided without undermining the efficiency of the compressive sampling process. Also, the sampling matrices required for encoding or decoding operations can be generated by the respective encoder and decoder as needed, such that the storage requirements associated with the codebook grow only logarithmically with the codebook size.

These and other features and advantages of the present invention will become more apparent from the accompanying drawings and the following detailed description.

BRIEF DESCRIPTION OF THE DRAWINGS

FIG. 1 is a block diagram of a processing system implementing secure compressive sampling in an illustrative embodiment of the invention.

FIG. 2 shows a more detailed view of an exemplary secure compressive sampling encoder of the FIG. 1 system.

DETAILED DESCRIPTION OF THE INVENTION

Figure 3:
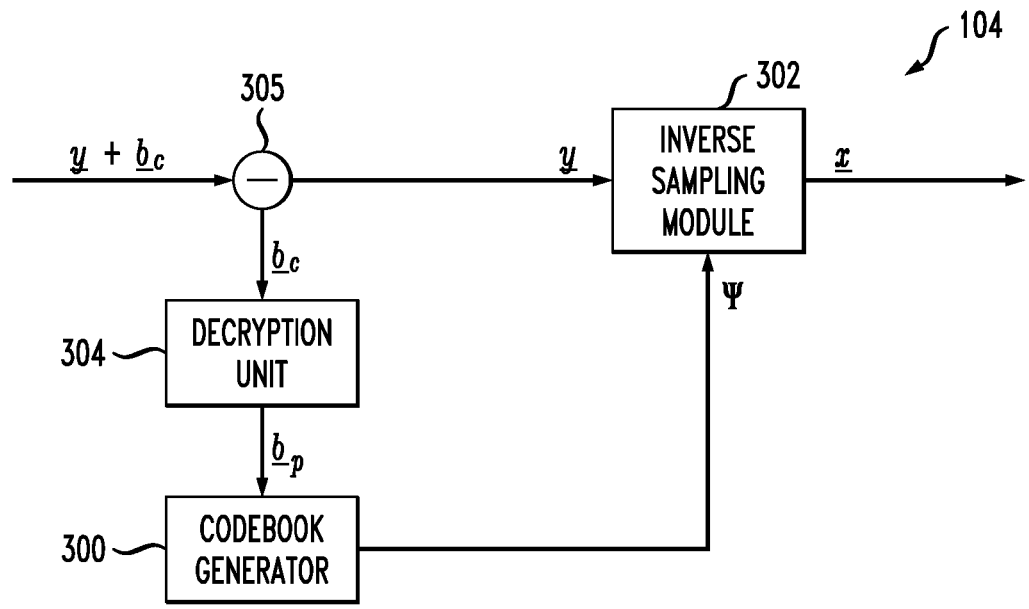
FIG. 3 shows a more detailed view of an exemplary secure compressive sampling decoder of the FIG. 1 system.

The present invention will be illustrated herein in conjunction with exemplary secure compressive sampling systems, devices and techniques. It should be understood, however, that the invention is not limited to use with the particular types of systems, devices and techniques disclosed. For example, aspects of the present invention can be implemented in a wide variety of other communication, storage or other processing system configurations, and in numerous alternative compressive sampling applications.

FIG. 1 shows a processing system 100 comprising a compressive sampling encoder 102 that is coupled to a compressive sampling decoder 104 via a channel 106. The channel may comprise, for example, a transmission medium or other communication channel of a communication system. As another example, the channel may comprise one or more read and write channels of a storage system, with the compressive sampling encoder 102 being used to write encoded data to the storage system and the compressive sampling decoder 104 being used to decode data read from the storage system.

The compressive sampling encoder 102 and decoder 104 are configured in the present embodiment to provide secure and efficient transmission, storage or other processing of sparse signals. More specifically, in this embodiment, a compressed measurement vector y can be transmitted, stored or otherwise processed, in a manner that ensures that a corresponding data vector x can be recovered only by authorized parties, without undermining the overall efficiency of the compressive sampling process.

As noted above, conventional compressive sampling generally involves multiplying an N-dimensional data vector x by the conjugate-transpose of an N×M dimensional sampling matrix $\Psi$ to yield an M-dimensional compressed measurement vector y, where typically M is much smaller than N.

In order for the compressive sampling process to be secure, then the sampling matrix $\Psi$ must be made available only to authorized parties, and hard to guess otherwise. Furthermore, a particular sampling matrix $\Psi$ should only be used to sample a limited number of different data vectors x before it is replaced by another matrix. Thus, there should be a large codebook of potential sampling matrices $\Psi$. It should be noted that it would be highly inefficient to encrypt the sampling matrix $\Psi$ itself, so that is not a viable security approach, and in that scenario it would likely be more efficient to encrypt the data vector x directly and not use compressive sampling at all.

The present embodiment utilizes a codebook of sampling matrices $\Psi$ that are selected such that any particular one of the sampling matrices can be constructed using a publicly-available codebook generator, the storage requirements of which increase only logarithmically with the size of the codebook.

FIG. 2 shows a more detailed view of the compressive sampling encoder 102 in an illustrative embodiment. The encoder 102 in this embodiment comprises a codebook generator 200, a sampling module 202, an encryption unit 204, and a signal combiner 205.

The codebook generator 200 is configured to determine a particular sampling matrix $\Psi$ selected from a codebook comprising a plurality of different sampling matrices. The codebook may be a publically-available codebook comprising $2^L$ different sampling matrices, where each of the matrices is identified by a unique L-digit binary index. By way of example, the codebook generator 200 may select an index uniformly at random from the $2^L$ possible indices each denoting a corresponding one of the $2^L$ different sampling matrices, and then generate the sampling matrix based on the selected index.

The codebook generator 200 is an example of what is more generally referred to herein as matrix determination circuitry. As will be described in greater detail below, the codebook generator is operative to generate the particular sampling matrix utilizing at least L+1 random matrices. More specifically, the code generator is operative to generate the particular N×M sampling matrix utilizing at least L independent N×N random matrices and an N×M random matrix, where the signal to be encoded comprises an N-dimensional data vector, the resulting encoded signal comprises an M-dimensional measurement vector, and M<<N.

The sampling module 202 receives the particular N×M sampling matrix $\Psi$ determined by the codebook generator 200 and applies a conjugate-transpose of that matrix to an N-dimensional data vector x to yield an M-dimensional compressed measurement vector y. The compressed measurement vector y is applied to one input of the signal combiner 205. In other embodiments, different techniques may be used to generate the compressed measurement vector using the selected sampling matrix. The term "applying" in the context of applying a matrix should therefore be construed broadly so as to encompass multiplication by the matrix or other processing that utilizes the matrix.

The encryption unit 204 is configured to receive the identifier of the particular sampling matrix $\Psi$ and to encrypt that identifier using well-known encryption techniques such as the advanced encryption standard (AES). More specifically, the encryption unit 204 receives the unique L-bit binary index of the selected sampling matrix $\Psi$ as a plaintext index vector $b_p$, and encrypts $b_p$ to generate a corresponding ciphertext index vector $b_c$. The ciphertext index vector $b_c$ is applied to another input of the signal combiner 205. The signal combiner 205 outputs the measurement vector y and the ciphertext index vector $b_c$ to the channel 106. In other embodiments, alternative techniques could be used to combine the measurement vector and the encrypted sampling matrix index, or the measurement vector and the encrypted index could be applied to separate transmission or storage channels.

FIG. 3 shows a more detailed view of the compressive sampling decoder 104 in an illustrative embodiment. The decoder 104 in this embodiment comprises a codebook generator 300, an inverse sampling module 302, a decryption unit 304, and a signal separator 305.

The signal separator 305 receives the measurement vector y and the ciphertext index vector $b_c$ from the channel 106. The measurement vector y is supplied to the inverse sampling module 302 and the ciphertext index vector $b_c$ is supplied to the decryption unit 304. The decryption unit 304 decrypts the ciphertext index vector $b_c$ to recover the plaintext index vector $b_p$ that specifies the unique L-bit binary index of the selected sampling matrix $\Psi$. The plaintext index vector $b_p$ is supplied to the codebook generator 300.

The codebook generator 300 uses the plaintext index vector $b_p$ as supplied by the decryption unit 304 to determine the particular sampling matrix $\Psi$ that was used by the encoder to generate the compressed measurement vector y. The sampling matrix $\Psi$ is supplied by the codebook generator to the inverse sampling module 302. The inverse sampling module 302 recovers the original data vector x by applying an inverse of the particular sampling matrix $\Psi$ to the measurement vector y.

Figure 4:
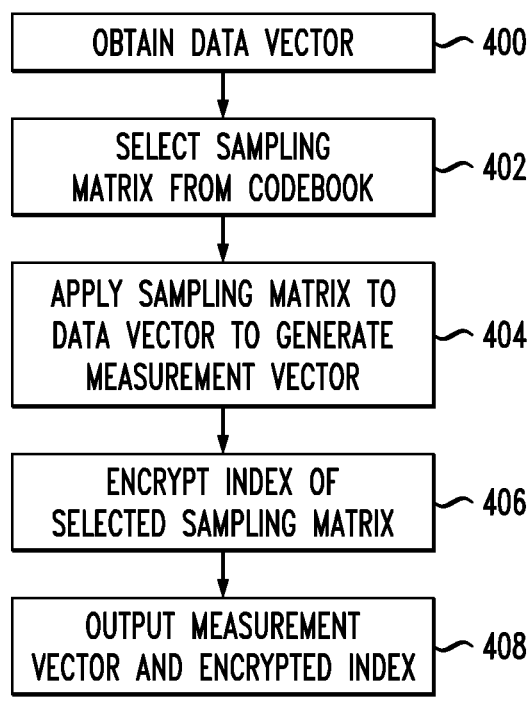
FIGS. 4 and 5 are flow diagrams illustrating the operation of the respective encoder and decoder of the FIG. 1 system.
Figure 5:
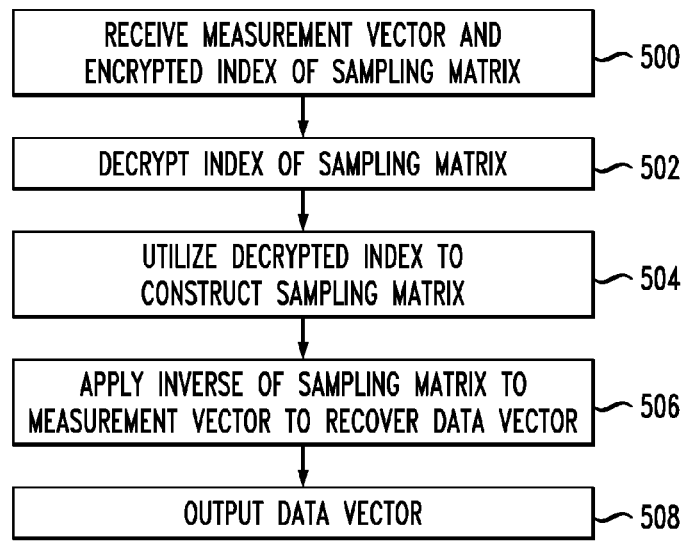

FIGS. 4 and 5 illustrate exemplary encoding and decoding processes implemented in the respective encoder 102 and decoder 104.

Referring initially to FIG. 4, the encoding process includes steps 400 through 408 as shown. A data vector to be encoded is obtained in step 400, and a particular sampling matrix is selected from the codebook in step 402. As indicated above, this may involve the codebook generator 200 selecting an index uniformly at random from the $2^L$ possible indices each denoting a corresponding one of the $2^L$ different sampling matrices, and then generating the sampling matrix based on the selected index. The selected sampling matrix is then applied to the data vector to generate a measurement vector, as indicated in step 404. The index of the selected sampling matrix is encrypted in step 406. Finally, in step 408 the encoder 102 outputs the measurement vector and the encrypted index to the channel 106.

In the corresponding decoding process shown in FIG. 5, the decoder 104 receives the measurement vector and the encrypted index of the sampling matrix from the channel 106, as indicated in step 500. The index of the sampling matrix is then decrypted in step 502. The decrypted index is utilized in step 504 to construct the sampling matrix that was used to generate the measurement vector. The inverse of this sampling matrix is applied in step 506 to the measurement vector in order to recover the original data vector. This data vector is output by the decoder in step 508.

Examples of codebooks of sampling matrices suitable for use in the embodiments of FIGS. 1 through 5 will now be described in greater detail. As indicated previously, the codebook may be a publically-available codebook comprising $2^L$ different sampling matrices, where each of the matrices is identified by a unique L-digit binary index. The codebook generators 200 and 300 can generate a particular sampling matrix utilizing L independent N×N random matrices and an N×M random matrix.

It will initially be assumed that the data vector x to be encoded in the compressive sampling encoder 102 comprises a vector of real values or a vector of complex values. It is further noted that matrices whose M column vectors are chosen to be mutually orthonormal satisfy the previously-mentioned restricted isometry property. Such matrices can be constructed by choosing the column vectors randomly, and furthermore to be isotropically random (i.e., each column is equally likely to point in any direction in the N-dimensional real or complex space). See T. L. Marzetta and B. M. Hochwald, "Capacity of a mobile multiple-antenna communication link in Rayleigh flat fading," IEEE Trans. on Information Theory, Vol. 45, No. 1, 1999, which is incorporated by reference herein.

Let $J=2^L$ be equal to the number of different sampling matrices $\Psi$ contained in the sampling matrix codebook, i.e., $L=\log_2(J)$. Let $b_p=\{b_L b_{L-1} \ldots b_1\}$ be the plaintext L-digit binary index that designates the particular sampling matrix $\Psi$ that is used. The codebook generators 200 and 300 each implement L independent N×N isotropically-random unitary matrices, denoted $\Omega_1, \Omega_2, \ldots \Omega_L$, and one N×M isotropically-random unitary matrix, denoted A. Given the plaintext binary index $b_p$, the associated N×M sampling matrix $\Psi$ is constructed by multiplying the N×M matrix A by a sequence of N×N matrices $\Omega_1, \Omega_2, \ldots \Omega_L$ in which each of the $\Omega_k$, k=1, 2, ... L, is raised to either the zero-th power or the first power depending on the value of the corresponding binary digit $b_k$:

$$\Psi_{\{b_L, \ldots b_1\}} = (\Omega_L^{b_L} \ldots \Omega_1^{b_1}) A$$

It can be shown that any sampling matrix $\Psi$ constructed in the manner described above is distributed marginally as isotropically-random unitary, and that the sampling matrices in any distinct pair of such sampling matrices are statistically independent. See T. L. Marzetta et al., "Structured Unitary Space-Time Autocoding Constellations," IEEE Trans. on Information Theory, Vol. 48, No. 4, 2002, which is incorporated by reference herein.

By way of example, a value of L=79 yields a secure codebook having $6.0446 \times 10^{23}$ sampling matrices, or approximately Avogadro's number of sampling matrices. Given a noisy version of the sampling matrix, or even an exact version of the sampling matrix, the only known way to recover the binary index of the sampling matrix would be exhaustively to compute all $2^L$ sampling matrices. There is no known iterative scheme to accomplish this. For example, successively flipping the binary digits to improve the match between a measured sampling matrix and a constructed sampling matrix cannot work: the pair-wise independence of the sampling matrices implies that the match is no better if only one binary digit is in error than if all binary digits were in error. In this sense the security is analogous to that provided by a binary combination lock.

As noted above, the data vector to be encoded may be a real-valued data vector or a complex-valued data vector, in which case the L independent N×N random matrices and the N×M random matrix may be isotropically-random unitary matrices, or more generally, isotropically-random orthogonal matrices. Typically, an orthogonal matrix is considered real-valued and a unitary matrix is considered complex-valued. These matrices may also be referred to as real orthogonal or complex orthogonal, respectively.

It should be noted that the techniques described above can also be used in applications not involving real-valued or complex-valued data vectors, such as applications in which signals are represented as strings of bits or are otherwise defined over a finite field. In the real or complex data vector embodiments, the elements of the codebook generator matrices $\Omega_1, \Omega_2, \ldots \Omega_L$ and A are real or complex numbers and the matrices are real or complex unitary. If we instead choose the elements of these codebook generator matrices uniformly at random from a finite field, and construct the sampling matrix $\Psi$ using the equation described previously, with its operations being carried out over the chosen finite field, then the resulting sampling matrix is random, satisfies the restricted isometry property, and any two distinct sampling matrices are statistically independent. Consequently, sampling matrices constructed in this way can be used for secure compressive sampling in applications requiring operations over finite fields, e.g., processing of quantized images.

Thus, in alternative embodiments, the L independent N×N random matrices and the N×M random matrix may be finite-field valued with independent identically-distributed random elements, and the data vector is similarly finite-field valued.

The illustrative embodiments provide a secure way to transmit, store or otherwise process a signal encoded using compressive sampling. Standard encryption techniques may be applied to encrypt the identifier of the sampling matrix used by the encoder, so as to ensure a desired level of security without undermining the efficiency of the compressive sampling process. Also, the sampling matrices required for encoding or decoding operations can be generated by the code generators 200 and 300 in the respective encoder 102 and decoder 104 as needed, such that the storage requirements associated with the codebook grow only logarithmically with the codebook size. As indicated previously, the sampling matrices of the codebook are random, and the sampling matrices in every distinct pair of such matrices are statistically independent. All of the security is in the encryption of the identifier of the selected sampling matrix, which as indicated above can be assured by methods known to those familiar with the art.

Applications of the compressive sampling techniques disclosed herein include, for example, communication systems and storage systems.

Figure 6:
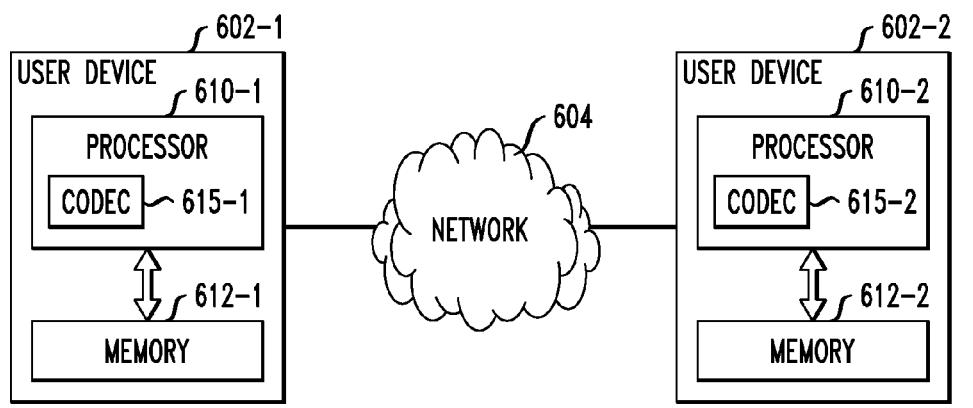
FIG. 6 shows one possible communication system application of a compressive sampling technique in accordance with the invention.

FIG. 6 shows one possible network-based configuration of a communication system 600 in an illustrative embodiment of the invention. In this embodiment, system 600 comprises at least first and second user devices 602-1 and 602-2 arranged to communicate with one another over a network 604.

The network 604 may comprise a wide area network such as the Internet, a metropolitan area network, a local area network, a cable network, a telephone network, a satellite network, as well as portions or combinations of these or other networks.

Each of the user devices 602 comprises a processor 610 coupled to a memory 612. Each processor implements a coder-decoder ("codec") 615 comprising a combination of encoder 102 and decoder 104 as previously described. Portions of the codec 615 may be implemented as dedicated hardware units within the corresponding processor, such as an encryption unit, or may be implemented in whole or in part using software that runs on general-purpose processing hardware.

Each of the memories 612 may therefore be used to store software programs that are executed by its associated processor 610 to implement portions of the codec 615. A given one of the memories may be an electronic memory such as random access memory (RAM), read-only memory (ROM) or combinations of these and other types of storage devices. Such a memory is an example of what is more generally referred to herein as a computer program product or still more generally as a computer-readable storage medium that has executable program code embodied therein. Other examples of computer-readable storage media may include disks or other types of magnetic or optical media, in any combination.

A given one of the user devices 602 may comprise a portable or laptop computer, mobile telephone, personal digital assistant (PDA), wireless email device, television set-top box (STB), server, or other communication device suitable for communicating with other devices over the network 604.

The system 600 may include additional components configured in a conventional manner. For example, each of the user devices 602 will generally include network interface circuitry for interfacing with the network 604.

Figure 7:
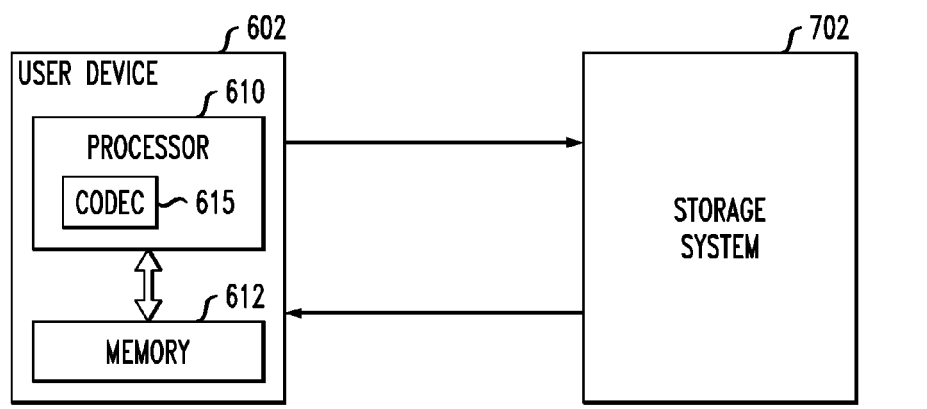
FIG. 7 shows one possible storage system application of a compressive sampling technique in accordance with the invention.

FIG. 7 shows a data storage system application 700 in which one of the user devices 602 interacts directly with a storage system 702. The codec 615 in this application is used to encode data for storage in storage system 700, and to decode previously-encoded data retrieved from the storage system 700.

It is to be appreciated that these example system applications are presented for purposes of illustration only, and the secure compressive sampling techniques disclosed herein can be used in numerous other applications, involving any type of signals, including video, images, audio, or other types of data, in any combination. As noted previously herein, compressive sampling is particularly well-suited for use with sparse signals, which are commonly found in diverse fields including wireless transmission, network security, computational imaging, astronomical data analysis, and life sciences, in particular, bioinformatics and neuroscience. Embodiments of the invention may be adapted for use in these and other contexts.

The various modules, units and other components shown in FIGS. 2 and 3 may be viewed as examples of circuitry used to implement the associated functionality. Such circuitry may comprise well-known conventional encoding and decoding circuitry suitably modified to operate in the manner described herein. For example, portions of such circuitry may comprise processor and memory circuitry associated with the processors 610 and memories 612 of FIGS. 6 and 7, matrix multiplication circuitry, or other types of arithmetic logic circuitry. Conventional aspects of such circuitry are well known to those skilled in the art and therefore will not be described in detail herein.

As indicated previously, embodiments of the present invention may be implemented at least in part in the form of one or more software programs that are stored in a memory or other computer-readable medium of a user device or other type of processing device. System components such as the compressive sampling encoder and decoder may be implemented at least in part using software programs. Of course, numerous alternative arrangements of hardware, software or firmware in any combination may be utilized in implementing these and other system elements in accordance with the invention. For example, embodiments of the present invention may be implemented in one or more field-programmable gate arrays (FPGAs), application-specific integrated circuits (ASICs) or other types of integrated circuit devices, in any combination. Such integrated circuit devices, as well as portions or combinations thereof, are examples of "circuitry" as the latter term is used herein.

It should again be emphasized that the embodiments described above are for purposes of illustration only, and should not be interpreted as limiting in any way. Other embodiments may use different types of system components and device configurations, depending on the needs of the particular compressive sampling application. Alternative embodiments may therefore utilize the techniques described herein in a wide variety of other contexts in which it is desirable to implement secure compressive sampling. Also, it should also be noted that the particular assumptions made in the context of describing the illustrative embodiments should not be construed as requirements of the invention. The invention can be implemented in other embodiments in which these particular assumptions do not apply. These and numerous other alternative embodiments within the scope of the appended claims will be readily apparent to those skilled in the art.

What is claimed is:

1. An apparatus comprising:
   a compressive sampling encoder, the encoder comprising:
   matrix determination circuitry configured to determine a particular sampling matrix selected from a codebook comprising a plurality of sampling matrices;
   sampling circuitry coupled to the matrix determination circuitry and configured to apply the particular sampling matrix to a first signal to generate a second signal, the second signal being compressed relative to the first signal; and
   encryption circuitry configured to receive an identifier of the particular sampling matrix and to encrypt the identifier of the particular sampling matrix;
   the compressive sampling encoder providing at one or more outputs thereof the second signal and the encrypted identifier of the particular sampling matrix.

2. The apparatus of claim 1 wherein the codebook comprises $2^L$ different sampling matrices and the identifier comprises an L-digit binary index identifying the particular sampling matrix.

3. The apparatus of claim 1 wherein the codebook is publically available.

4. The apparatus of claim 2 wherein the matrix determination circuitry comprises a codebook generator operative to generate one or more of the sampling matrices of the codebook including the particular sampling matrix.

5. The apparatus of claim 4 wherein the codebook generator is operative to generate the particular sampling matrix utilizing at least L+1 random matrices.

6. The apparatus of claim 5 wherein the codebook generator is operative to generate the particular sampling matrix utilizing at least L independent N×N random matrices and an N×M random matrix, where the first signal comprises an N-dimensional data vector, the second signal comprises an M-dimensional measurement vector, and M<<N.

7. The apparatus of claim 6 wherein the codebook generator is operative to generate the particular sampling matrix in accordance with the following equation:

$$\Psi\{b_L, \ldots b_1\} = (\Omega_L^{b_L} \ldots \Omega_1^{b_1})A$$

where $\Psi$ denotes the particular sampling matrix, said sampling matrix having an L-bit binary index given by $\{b_L\ b_{L-1} \ldots B1\}$, $\Omega_1, \Omega_2, \ldots \Omega_L$ denotes said L independent N×N random matrices, and A denotes said N×M random matrix.

8. The apparatus of claim 6 wherein the L independent N×N random matrices and the N×M random matrix are isotropically-random orthogonal, and wherein the data vector comprises one of a real-valued data vector and a complex-valued data vector.

9. The apparatus of claim 6 wherein the L independent N×N random matrices and the N×M random matrix are finite-field valued with independent identically-distributed random elements, and wherein the data vector is similarly finite-field valued.

10. A compressive sampling encoding method comprising the steps of:
    determining a particular sampling matrix selected from a codebook comprising a plurality of sampling matrices;
    applying the particular sampling matrix to a first signal to generate a second signal, the second signal being compressed relative to the first signal;
    encrypting an identifier of the particular sampling matrix; and
    outputting the second signal and the encrypted identifier of the particular sampling matrix;
    wherein the determining, applying, encrypting and outputting steps are performed by a processor.

11. A non-transitory computer-readable storage medium having embodied therein executable program code that when executed by a processor causes a compressive sampling encoder to perform the steps of:
    determining a particular sampling matrix selected from a codebook comprising a plurality of sampling matrices;
    applying the particular sampling matrix to a first signal to generate a second signal, the second signal being compressed relative to the first signal;
    encrypting an identifier of the particular sampling matrix; and
    outputting the second signal and the encrypted identifier of the particular sampling matrix.

12. An apparatus comprising:
    a compressive sampling decoder, the decoder comprising:
    decryption circuitry configured to receive an encrypted identifier of a particular sampling matrix selected from a codebook comprising a plurality of sampling matrices and to decrypt the encrypted identifier of the particular sampling matrix;
    matrix determination circuitry configured to determine the particular sampling matrix based on the decrypted identifier; and
    inverse sampling circuitry coupled to the matrix determination circuitry and configured to generate a first signal by applying an inverse of the particular sampling matrix to a second signal, the second signal being compressed relative to the first signal.

13. The apparatus of claim 12 wherein the codebook comprises $2^L$ different sampling matrices and the identifier comprises an L-digit binary index identifying the particular sampling matrix.

14. The apparatus of claim 12 wherein the codebook is publically available.

15. The apparatus of claim 13 wherein the matrix determination circuitry comprises a codebook generator operative to generate one or more of the sampling matrices of the codebook including the particular sampling matrix.

16. The apparatus of claim 15 wherein the codebook generator is operative to generate the particular sampling matrix utilizing at least L+1 random matrices.

17. The apparatus of claim 16 wherein the codebook generator is operative to generate the particular sampling matrix utilizing at least L independent N×N random matrices and an N×M random matrix, where the first signal comprises an N-dimensional data vector, the second signal comprises an M-dimensional measurement vector, and M<<N.

18. The apparatus of claim 17 wherein the codebook generator is operative to generate the particular sampling matrix in accordance with the following equation:

$$\Psi\{b_L, \ldots b_1\} = (\Omega_L^{b_L} \ldots \Omega_1^{b_1})A$$

where $\Psi$ denotes the particular sampling matrix, said sampling matrix having an L-bit binary index given by $\{b_L, b_{L-1}\}, \ldots b_1\}$, $\Omega_1, \Omega_2, \ldots \Omega_L$ denotes said L independent N×N random matrices, and A denotes said N×M random matrix.

19. A compressive sampling decoding method comprising the steps of:
    decrypting an encrypted identifier of a particular sampling matrix selected from a codebook comprising a plurality of sampling matrices;
    determining the particular sampling matrix based on the decrypted identifier; and
    generating a first signal by applying an inverse of the particular sampling matrix to a second signal, the second signal being compressed relative to the first signal;
    wherein the decrypting, determining and generating steps are performed by a processor.

20. A non-transitory computer-readable storage medium having embodied therein executable program code that when executed by a processor causes a compressive sampling decoder to perform the steps of:
    decrypting an encrypted identifier of a particular sampling matrix selected from a codebook comprising a plurality of sampling matrices;
    determining the particular sampling matrix based on the decrypted identifier; and generating a first signal by applying an inverse of the particular sampling matrix to a second signal, the second signal being compressed relative to the first signal.

\* \* \* \* \*